United States Patent
Li et al.

(10) Patent No.: US 8,957,496 B2
(45) Date of Patent: Feb. 17, 2015

(54) INTEGRATED CIRCUIT CHIP WITH DISCONTINUOUS GUARD RING

(71) Applicants: Qiang Li, Gilbert, AZ (US); Olin L. Hartin, Phoenix, AZ (US); Sateh Jalaleddine, Phoenix, AZ (US); Radu M. Secareanu, Phoenix, AZ (US); Michael J. Zunino, Tempe, AZ (US)

(72) Inventors: Qiang Li, Gilbert, AZ (US); Olin L. Hartin, Phoenix, AZ (US); Sateh Jalaleddine, Phoenix, AZ (US); Radu M. Secareanu, Phoenix, AZ (US); Michael J. Zunino, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 38 days.

(21) Appl. No.: 13/864,729

(22) Filed: Apr. 17, 2013

(65) Prior Publication Data
US 2014/0312457 A1 Oct. 23, 2014

(51) Int. Cl.
*H01L 21/70* (2006.01)
*H01L 21/76* (2006.01)
*H01L 27/02* (2006.01)

(52) U.S. Cl.
CPC ............ *H01L 27/0203* (2013.01); *H01L 21/76* (2013.01)
USPC ............................ 257/500; 257/531; 438/400

(58) Field of Classification Search
USPC .................................... 257/500, 531; 438/400
See application file for complete search history.

(56) References Cited

U.S. PATENT DOCUMENTS

| | | | |
|---|---|---|---|
| 5,864,168 A * | 1/1999 | Nasserbakht | 257/500 |
| 7,138,686 B1 | 11/2006 | Banerjee et al. | |
| 7,608,913 B2 | 10/2009 | Secareanu et al. | |
| 7,834,428 B2 | 11/2010 | Secareanu et al. | |

OTHER PUBLICATIONS

Chuan-Jane Chao et al., "Characterization and Modeling of On-Chip Inductor Substrate Coupling Effect," IEEE Radio Frequency Integrated Circuits Symposium, pp. 311-314 (2002).

Mohd Hafis Mohd Ali et al., "The Impact of Electromagnetic Coupling of Guard Ring Metal Lines on the Performance of On-Chip Spiral Inductor in Silicon CMOS," $2^{nd}$ Asia Sumposium on Quality Electronic Design, pp. 285-288 (2010).

* cited by examiner

*Primary Examiner* — Mark Prenty
(74) *Attorney, Agent, or Firm* — Lempia Summerfield Katz LLC

(57) ABSTRACT

An electronic apparatus includes a semiconductor substrate, a circuit block disposed in and supported by the semiconductor substrate and comprising an inductor, and a discontinuous noise isolation guard ring surrounding the circuit block. The discontinuous noise isolation guard ring includes a metal ring supported by the semiconductor substrate and a ring-shaped region disposed in the semiconductor substrate, having a dopant concentration level, and electrically coupled to the metal ring, to inhibit noise in the semiconductor substrate from reaching the circuit. The metal ring has a first gap and the ring-shaped region has a second gap.

20 Claims, 3 Drawing Sheets

INTEGRATED CIRCUIT CHIP WITH DISCONTINUOUS GUARD RING

FIELD OF INVENTION

The present embodiments relate to semiconductor devices.

BACKGROUND

Mixed signal integrated circuit (IC) chips that include both analog and digital circuit blocks often suffer from noise issues. Devices in the digital circuit blocks are typically noisy. In contrast, devices in the analog circuit blocks, such as phase-locked loops and low noise amplifiers, are usually sensitive to noise. The sensitivity of some analog circuit blocks, such as those in radio frequency ICs (RFICs), is heightened by the presence of on-chip passive elements, such as inductors. Efforts are typically made to protect such circuits from substrate, power/ground, and other electromagnetic interference.

Interest in minimizing the costs of mixed signal IC chips has resulted in increases in device density. The noisy devices and noise-sensitive devices are thus more likely to be positioned close to one another. Without proper noise isolation, noise generated by the noisy digital circuit blocks can interfere with sensitive analog circuit blocks.

Noise isolation is often provided by a conductive shield positioned between the analog and digital circuit blocks. One type of conductive shield is a grounded guard ring. In a typical arrangement, the grounded guard ring surrounds an analog circuit block to prevent the electromagnetic coupling of the noise to an inductor of the analog circuit block.

With the analog circuit blocks and digital circuit blocks formed in the same substrate, noise may also pass through the substrate. Substrate coupling allows noise at a node in a digital circuit block to reach a node in an analog circuit block. Noise isolation regions are accordingly formed in the substrate between the analog and digital circuit blocks to prevent such substrate coupling.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Figure 1:
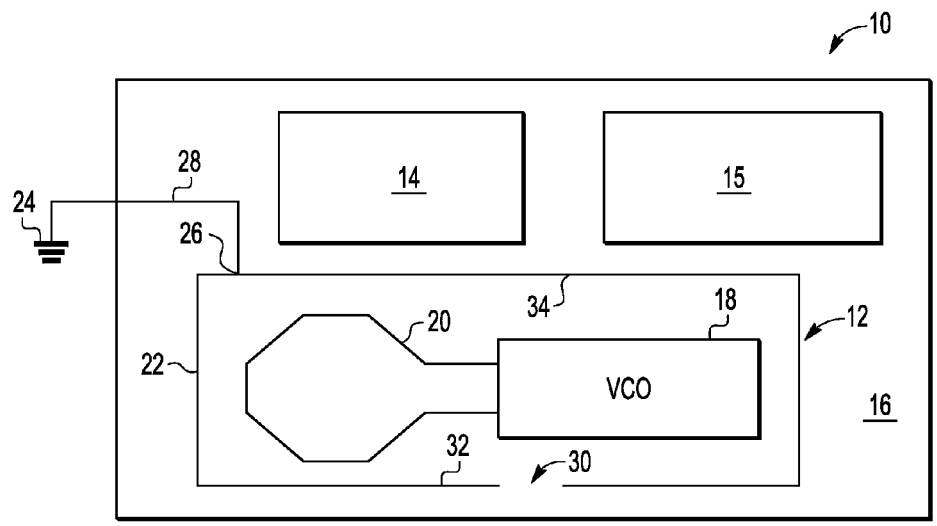
FIG. 1 is a partial, top, schematic view of an exemplary IC apparatus having a discontinuous guard ring in accordance with one embodiment.

Integrated circuit (IC) chips with a discontinuous guard ring are described. Methods of fabricating such IC chips are also described. The discontinuous guard ring surrounds a circuit block to provide electromagnetic noise isolation. The discontinuous nature of the guard ring reduces or minimizes electromagnetic disruption of the performance of an inductor of the circuit block. Without the discontinuity in the guard ring, a closed guard ring may adversely impact the inductance (L) and/or quality factor (Q) of the inductor. For example, a closed ring may decrease inductance by as much as 4% and the quality factor by as much as 5% at frequencies of about 2.5 GHz. In contrast, the disclosed embodiments do not include a full loop or closed ring to avoid such adverse effects. The lack of a full loop reduces the extent to which electromagnetic coupling between the guard ring and the inductor occurs. With such coupling minimized or prevented, the adverse effects of the guard ring on the inductor may be avoided. Optimal inductor performance may thus be maintained while achieving optimal noise isolation.

The discontinuity in the guard ring may allow the spacing between the guard ring and the inductor to be decreased, thereby saving chip area. In some examples, the spacing between the inductor and the guard ring may be decreased by about 50% or more. In one exemplary layout, the spacing may decrease from about 50 to about 60 µm to about 30 µm or less. The resulting area savings may be achieved without adverse effects on inductor performance. For example, the same quality factor may be achieved in a significantly smaller area.

The discontinuous guard ring includes gaps in constituent components or layers of the guard ring. In some embodiments, the guard ring has a metal ring and a ring-shaped substrate region. Each such component or layer includes a respective gap to establish the discontinuous nature of the guard ring. In some embodiments, the gaps are not aligned. The metal ring may include a finger or flap that extends across or over the gap in the ring-shaped substrate region. As described below, the flap may include a metal overlap of the gap, which may present an impedance that configures a frequency response of the guard ring, thereby impacting the performance of the circuit inside the guard ring, including the inductor. The guard ring may act as a frequency filter. The configuration of the gap, including, for instance, one or more lateral dimensions of the gap, may be used to customize the frequency behavior and/or other behavior of the guard ring.

The gaps and other aspects of the discontinuous guard ring may be optimized to achieve a sufficient level of noise isolation with an acceptable level of inductor performance degradation. Without more, introducing a gap into a guard ring may be challenging or disadvantageous for noise isolation. However, the configuration of the gaps of the disclosed embodiments may allow sufficient noise isolation to be provided. The positioning, size, construction, and other characteristics of the gaps may be configured to preserve the isolation capabilities of a full loop guard ring. In some cases, a certain (e.g., negligible) amount of noise may reach the inductor surrounded by the guard ring. Thus, the term "noise isolation" is used herein in a broad sense and is not intended to imply that noise transmission is prevented in its entirety.

The discontinuous guard rings of the disclosed embodiments may be useful with a variety of different circuits and inductor designs. The circuits may be radio frequency (RF) having an LC tank or other RF or analog circuits. Although described herein in connection with a voltage-controlled oscillator (VCO), the disclosed embodiments are not limited to any particular type of circuit block, IC chip, or electronic apparatus.

Although described below in connection with a bulk substrate, the disclosed IC chips, apparatus, and fabrication methods are not limited to any particular substrate type or fabrication technology. The semiconductor substrates of the disclosed devices may vary. The configuration, profile, conductivity type, dopant material(s), and other characteristics of the ring-shaped substrate region may also vary. For instance, the disclosed devices and methods are not limited to gaps involving shallow trench isolation (STI) regions. For example, the gaps may be formed or located in active areas of the IC chip.

Although described below in connection with p-type ring-shaped substrate regions, the disclosed devices are not limited to any particular conductivity type framework. P-type substrates and p-type substrate regions are described herein for convenience of description and without any intended limitation. Thus, n-type substrates and n-type substrate regions may be provided by, for example, substitution of semiconductor regions of opposite conductivity type. For example, each semiconductor region, layer or other structure in the examples described below may have a conductivity type (e.g., n-type or p-type) opposite to the type identified in the examples below.

FIG. 1 shows a top view of a portion of an IC chip 10 having a circuit block 12 configured in accordance with one embodiment. The IC chip 10 may be a mixed signal IC chip having a combination of digital and analog circuit blocks. The circuit block 12 may be an analog circuit block. In this example, the IC chip 10 includes digital circuit blocks 14, 15 in addition to the circuit block 12. The circuit block 12 and the digital circuit blocks 14 are disposed in and supported by a semiconductor substrate 16. For instance, each circuit block 12, 14, 15 may include a number of transistor devices (e.g., n-channel and/or p-channel field effect transistor devices) having regions disposed or formed within the semiconductor substrate 16. A number of conductive layers are then deposited on the semiconductor substrate 16 to form various structures, including contacts to the regions within the semiconductor substrate 16, transistor gates, interconnects, etc.

The circuit block 12 may be disposed on the mixed signal IC chip 10 along with any number of analog circuit blocks and any number of digital circuit blocks. The semiconductor substrate 16 is a common substrate in which each of such analog and digital circuit blocks is formed. The arrangement of the analog and digital circuit blocks may vary. For example, the digital circuit blocks 14, 15 need not be adjacent to, disposed along a single side of, or otherwise near, the circuit block 12 as shown.

In this example, the circuit block 12 includes a voltage-controlled oscillator (VCO) circuit 18 with an inductor 20. The VCO circuit 18 is configured as an LC tank-based VCO. The VCO circuit 18 also includes a number of transistor devices (e.g., field effect transistor devices) disposed in the semiconductor substrate 16. Additional or alternative analog circuits or devices may be included in the circuit block 12. For example, the circuit block 12 may include a phase-locked loop circuit in alternative or addition to the VCO circuit 18. The inductor 20 may be disposed in a variety of LC tank arrangements. The inductor 20 may be disposed in other arrangements and incorporated into a variety of different circuits.

The layout, construction, configuration, and other characteristics of the inductor 20 may vary. The inductor 20 need not be loop-shaped as shown. Additional or alternative shapes may be used. For example, the inductor 20 need not be planar. In some cases, the inductor 20 includes one or more metal layers supported by the semiconductor substrate 16. For example, the inductor 20 may include an adhesion metal layer, a transition metal layer, and a high conductivity metal layer. In other embodiments, the inductor 20 may include one or more non-metal layers (e.g., polysilicon) supported by the semiconductor substrate 16 or disposed within the semiconductor substrate 16 (e.g., one or more highly doped semiconductor regions).

The IC chip 10 includes a guard ring 22 that surrounds the circuit block 12 to isolate the components of the circuit block 12 from external noise. The external noise may be generated by the digital circuit blocks 14, 15. The guard ring 22 may protect the circuit block 12 from alternative or additional noise sources, including off-chip noise sources. The guard ring 18 includes multiple components arranged in layers to address the different paths along which the noise may propagate to reach the circuit block 12. As described below, one or more layers may be supported by the semiconductor substrate 16 of the IC chip 12, and one or more layers may be disposed within the semiconductor substrate 16. The multiple components may have a common layout or pattern, such as the rectilinear pattern shown in FIG. 1. Alternatively, different layouts may be used for the different components of the guard ring 18.

The guard ring 22 may be grounded. In this example, the guard ring 22 is connected to a ground pad 24 of the IC chip 10 at a grounding point 26 along the guard ring 22. The ground 24 may correspond with or include a ground pad or other node of the IC chip 10 dedicated to the circuit block 12. Additional grounding points may be used. The guard ring 22 may be electrically connected to the ground pad 24 via one or more interconnects 28. The guard ring 22 may be biased at any desired voltage.

The grounding point 26 may be positioned near one or more noise sources. In this example, the grounding point 26 is located along a side of the guard ring 22 adjacent the digital circuit blocks 14, 15. The location of the grounding point 26 may vary. For example, the grounding point 26 may be centered between the digital circuit blocks 14, 15, centered within one of the digital circuit blocks 14, 15 deemed to generate the most significant noise, or otherwise positioned near one or both of the digital circuit blocks 14, 15. The grounding point 26 may be selected based on the distribution of the noise on the IC chip 10, with the grounding point 26 being positioned as close as possible to maxima of the noise distribution.

The guard ring 22 is a discontinuous guard ring. The discontinuity may reduce electromagnetic coupling with the inductor 20. In this example, the guard ring 22 includes a gap 30. The guard ring 22 is thus divided into two segments 32, 34 or sections on either side of the grounding point 26. As described below, the gap 30 is formed via respective, constituent gaps in the components or layers of the guard ring 22. The discontinuous nature of the guard ring 22 may be used to minimize the extent to which the guard ring 22 adversely affects the performance of the inductor 20. The gap 30 may be configured to optimize the noise isolation provided by the guard ring 22 in view of the effect on the inductor 20. For example, the size (e.g., length) of the gap 30 may be selected to ensure that sufficient noise isolation is provided given an acceptable decrease in inductance (L) and/or quality factor (Q) of the inductor 20.

The gap 30 may be positioned along the guard ring 22 based on the location of the noise source(s) and/or the grounding point 26. While the grounding point 26 may be disposed at a position along the guard ring 22 proximate the noise source(s), the gap 30 may be disposed along the guard ring 22 distal the noise source(s). In this example, the gap 30 is disposed along a side of the guard ring 22 opposite the side adjacent the digital circuit blocks 14, 15. The gap 30 need not be on an opposite side as shown, and may be otherwise spaced from the noise source(s). In cases where the noise is uniformly distributed across the IC chip 10, the location of the gap 30 may be selected based on other factors, including, for example, those described below.

The location of the gap 30 may be selected based on the position of the grounding point 26 (and vice versa). The gap 30 (and the respective, constituent gaps thereof) may be positioned along the guard ring 22 relative to the grounding point 26 to achieve impedance symmetry. For instance, the gap 30 may be positioned such that the segments 32, 34 have the same, or roughly the same, impedance. The impedance may be measured from the grounding point 26 to the finger ends of the segments 32, 34 at the gap 30. The impedance symmetry of the segments 32, 34 may configure the guard ring to provide effective and efficient isolation along all sections of the guard ring 22.

The layout or pattern of the guard ring 22 may vary from the example shown. For example, the guard ring 22 need not have a rectilinear shape. The guard ring 22 may have any number of sides, segments, or sections. The incorporation of additional sides or segments may allow the gap 30 to be positioned distal from the noise source(s) while still presenting impedance-symmetric segments. The lateral width, materials, thickness, or other characteristics of the guard ring 22 may also or alternatively be varied along one or both of the segments 32, 34 to adjust the position of the gap 30 and maintain impedance symmetry. The lengths of the segments 32, 34 may thus differ.

The guard ring 22 may be configured for noise isolation across a wide range of frequencies. The frequency response of the guard ring 22 may be configured by adjusting the parasitic capacitance presented by the guard ring 22 (or, e.g., a metal ring thereof) relative to the grounding point 26. Other sources of parasitic capacitance may also be taken into account, including, for instance, the parasitic capacitance of the packaging and the printed circuit board. In some cases, the frequency response is relatively flat up to a nominal high frequency (e.g., based upon the above-referenced parasitic capacitances), after which noise isolation decreases. These and other characteristics of the guard ring 22 may be configured as described below to provide broadband or narrow band noise isolation.

The guard ring 22 also presents an inductance in series with the capacitance introduced by the gap 30 in the guard ring 22. The resulting LC circuit is determinative of the frequency response characteristics of the guard ring 22. In some embodiments, the guard ring 22 may be configured to adjust the magnitude of the inductance (e.g., to reach a desired value) and, in turn, customize the frequency response characteristics of the guard ring 22. For example, the length of the guard ring 22 may be adjusted. Such configuration of the guard ring 22 may be useful in establishing a desired level of impedance presented by the gap 30 for effective noise isolation over a given range of frequencies. Alternatively or additionally, such configuration of the guard ring 22 may be useful for establishing a resonant frequency of the LC circuit at which the impedance presented by the gap 30 is effectively zero. At the resonant frequency, the guard ring 22 may act as a closed ring.

Figure 2:
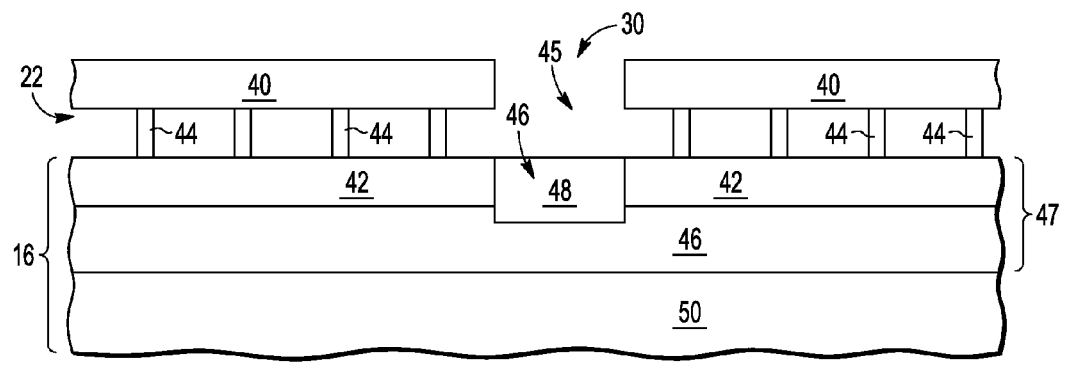
FIG. 2 is a cross-sectional, schematic view of the discontinuous guard ring of the IC apparatus of FIG. 1 in accordance with one embodiment.

FIG. 2 shows a portion of the guard ring 22 with the gap 30 in greater detail. The guard ring 22 includes a metal ring 40 supported by the semiconductor substrate 16, and a ring-shaped region 42 disposed in the semiconductor substrate 16 and electrically coupled to the metal ring 40. The metal ring 40 may be configured to block or otherwise inhibit noise from reaching the circuit block 12 (FIG. 1) along paths above the semiconductor substrate 16. The ring-shaped region 42 may be configured to block or otherwise inhibit noise paths through the semiconductor substrate 16. To establish the gap 30 (FIG. 1) in the guard ring 22, the metal ring 40 has a gap 45 and the ring-shaped region 42 has a gap 46. In this embodiment, the gaps 45 and 46 are aligned with one another.

The metal ring 40 and the ring-shaped region 42 are electrically connected by a number of vias 44. The vias 44 may be regularly distributed and laterally spaced from one another along the guard ring 22 as shown. The density of the vias 44 may vary. Each via 44 may include a metal or other conductive structure that extends upward from a surface of the semiconductor substrate 16 to reach the metal ring 40. The vias 44 may pass through one or more passivation layers, such as silicon nitride. Other dielectric materials, such as silicon dioxide and tetraethyl orthosilicate (TEOS) may be used. The passivation layers are not shown in FIG. 2 and other cross-sectional views of the present application for ease in illustration of the disclosed embodiments.

The ring-shaped region 42 may have a dopant concentration level to establish a conductive path through the semiconductor substrate 16 along the guard ring 22. The conductive path may be configured to block or otherwise inhibit noise in the semiconductor substrate 16 from reaching the circuit block 12 (FIG. 1). In one example, the ring-shaped region 42 includes a heavily doped p-type region. The ring-shaped region 42 may be doped to establish Ohmic contacts with the vias 44 at the surface of the semiconductor substrate 16. The ring-shaped region 42 may be formed via one or more implantation procedures used to form other contact regions, such as body contact region or source/drain contact regions. In this example, the ring-shaped region 42 is disposed within a p-type well 46. The p-type well 46 may be formed in an epitaxial layer 47 of the semiconductor substrate 16. For example, the p-type well 46 may be formed via an implantation procedure after the growth of the epitaxial layer 47. Alternatively, the p-type well 46 may be formed during the growth of the epitaxial layer 47. The epitaxial layer 47 may be a lightly p-type doped (p-) layer or a lightly n-type doped (n-) layer. The ring-shaped region 42 need not be disposed at the surface of the semiconductor substrate 16. For example, the ring-shaped region 42 may include a buried region spaced from the surface.

The gap 46 in the ring-shaped region may include a shallow trench isolation (STI) region 48 disposed at the surface of the semiconductor substrate 16. In this example, the STI region 48 extends across the entire length of the gap, thereby defining the size of the gap 46. The STI region 46 may include silicon oxide and/or another dielectric material. The gap 46 may include alternative or additional structures or materials. In this example, a lower boundary of the STI region 48 is at a lower depth than the lower boundary of the ring-shaped region 42. The STI region 48 may thus extend into the p-type well 46. The depth of the lower boundary may vary. For example, a deep trench isolation (DTI) or other isolation region may be disposed in the gap 46 in other embodiments. In some cases, the isolation region may reach a depth beyond the p-type well 46.

The metal ring 40 may include a stack of metal layers. For example, the metal ring 40 may include an adhesion metal layer, one or more transition metal layers, and one or more conduction layers. The adhesion metal layer may include Ti, TiN, TiW, Cr, and/or other metals for adhesion to the passivation layer on which the metal ring 40 is deposited. The transition metal layer(s) may include Ni, Mo, Pd, Pt, and/or other metals disposed between the adhesion and conduction metal layers of the stack. The conduction metal layer(s) may include copper, gold, and/or other low resistivity metals.

The metal ring 40 may be located in one or more interconnect layers of the IC chip 10. Such interconnect layers may be deposited on, over, or otherwise supported by, the semiconductor substrate 16. The metal ring 40 may be formed during the formation of one or more interconnects of the circuits 12, 14, and/or 15 (FIG. 1). In other embodiments, the metal ring 40 is formed separately from the interconnects or interconnect layers of the IC chip 10.

The semiconductor substrate 16 may include a number of epitaxial layers in which the ring-shaped region 42 and other regions are formed. In one example, the semiconductor substrate 16 includes a single p-type epitaxial layer (e.g., the epitaxial layer 47) grown on an original p-type substrate 50. The original substrate 50 may be a heavily doped p-type substrate in some cases, such as those having multiple epitaxial layers. The semiconductor substrate 16 may alternatively or additionally include non-epitaxial layers in which one or more device regions are formed. Any one or more of the layers of the semiconductor substrate 16 may include silicon, GaAs, GaN, or other semiconductor materials. In this example, the semiconductor substrate 16 has a bulk substrate, although silicon-on-insulator (SOI) substrates may be used. An insulator layer disposed on an original substrate may include, for example, silicon oxide. The structural, material, and other characteristics of the semiconductor substrate 16 may vary from the examples referenced above. Additional, fewer, or alternative layers may be included in the semiconductor substrate 16. For example, any number of additional semiconductor and/or non-semiconductor layers may be included. The disclosed devices are thus not limited to, for instance, SOI or bulk substrates, or substrates including epitaxially grown layers, and instead may be supported by a wide variety of other types of semiconductor substrates.

Figure 3:
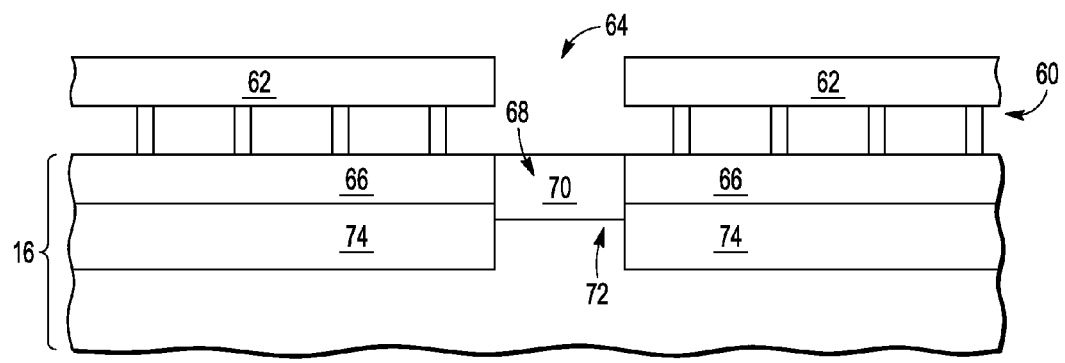
FIG. 3 is a cross-sectional, schematic view of an exemplary discontinuous guard ring with a p-well block in accordance with one embodiment.

FIG. 3 is a cross-sectional view of another guard ring 60 having a different gap configuration. The guard ring 60 includes a metal ring 62 with a gap 64 and a ring-shaped region 66 with a gap 68. The metal ring 62, the ring-shaped region 66, and one or more other components of the guard ring 60 (e.g., the vias) may be configured as described above in connection with FIG. 2. For instance, the ring-shaped region 66 may include a p-type well, as described above. In this embodiment, the gap 68 in the ring-shaped region 66 includes an STI region 70 and a p-well block region 72 adjacent the STI region 70. The STI region 70 may be configured as described above in connection with FIG. 2. The p-well block region 70 is disposed in the semiconductor substrate 16. In this embodiment, the p-well block region 72 is a buried region disposed below or under the STI region 70. In some cases, the p-well block region 72 is formed by patterning a p-type well 74 to align the p-well block region 72 with the gap 68. The p-well block region 72 may thus correspond with an un-doped (or less heavily doped) portion of the semiconductor substrate 16. For example, the p-well block region 72 may include or correspond with a portion of an epitaxial layer of the semiconductor substrate 16.

The p-well block region 72 may have a dopant concentration level to effectively act as an insulator between ends of the p-type well 74. The p-well block region 72 may be used to prevent current flow around the STI region 70 that may otherwise pass through the p-type well 74.

In an alternative embodiment, the p-well block region 72 is disposed at the surface of the semiconductor substrate 16. The p-well block region 72 may replace the STI region 70 or be disposed alongside the STI region 70.

Figure 4:
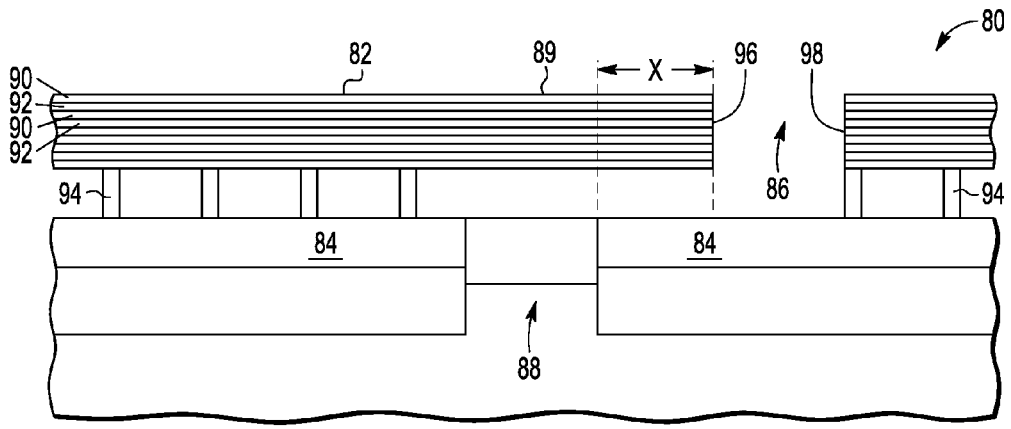
FIG. 4 is a cross-sectional, schematic view of an exemplary discontinuous guard ring with non-aligned metal and substrate gaps in accordance with one embodiment.

FIG. 4 is a cross-sectional view of another guard ring 80 having a flapped gap configuration. In this embodiment, a metal ring 82 and a ring-shaped region 84 of the guard ring 80 have respective gaps 86 and 88 not aligned with one another. The metal ring 82 has a flap 89 of finger that extends over the gap 88. The flap 89 may be supported by one or more passivation layers as described above. The length of the flap 89 may vary. In this example, the flap 89 extends across the entire gap 88. The gap 86 in the metal ring 82 is laterally offset from the gap 88 in the ring-shaped region 84 to an extent that the gaps 86, 88 do not overlap. The extent of the offset may vary. For example, the gaps 86, 88 may be offset but partially overlap in other cases. A spacing X between the gaps 86, 88 may vary as well. In some examples, the spacing X may be selected to achieve a desired frequency response. In some cases, the metal ring 82 may extend laterally across the gap 88 in the ring-shaped region 84 to an extent based on an expected frequency range of the noise.

The flapped gap configuration establishes capacitive coupling between the metal ring 82 and the substrate. At high frequencies (e.g., around 2.5 GHz), the capacitive coupling may minimize the effect of a wider gap in the metal ring 82 and/or the ring-shaped region 84. The noise may capacitively sink into the flap 89. A frequency dependent analysis of the capacitance presented by the metal ring 82 and the substrate may be used to configure the flap 89 in view of the expected frequency range of the noise.

The gaps 86, 88 need not have the same size (e.g., length). In this example, the gap 86 may be shorter than the gap 88. The relative sizes of the gaps in the other embodiments described herein may also vary.

FIG. 4 also shows how the metal ring 82 includes a stack of metal layers. The metal layers may be deposited upon one another to form the metal ring 82. In this example, the stack includes alternating metal layers, including first metal layers 90 and second metal layers 92. The first metal layers 90 may include any one of the above-referenced metal layers, and the second metal layers 92 may include other one of the above-referenced metal layers. A dielectric layer (e.g., silicon dioxide, silicon nitride, and/or other dielectric materials) may be disposed between each adjacent pair of the first and second metal layers 90, 92, which may then be connected by any number of vias (not shown). The dielectric layers may be configured as thin films. The films may have a thickness much less than the thickness of the metal layers 90, 92, and are thus not shown in FIG. 4. Alternatively, FIG. 4 may be viewed as depicting the dielectric layers, in which case the layers 92 may be considered the dielectric layers and understood to fill in and extend across the gap 86. Additional or alternative metals may be used or incorporated into the stack. For example, the alternating layers of the first and second metal layers may be in addition to any adhesion and/or transition metal layers of the stack. Each of the metal layers may be deposited in connection with a first metal deposition procedure. In some cases, the metal layers may be deposited in connection with forming interconnects.

The metal ring 82 and the ring-shaped region 84 are electrically connected by vias 94. The vias 94 may be configured or constructed similarly to the vias described in connection with other embodiments. However, the location of the vias 94 relative to the gaps 86, 88 may differ. In the embodiment of FIG. 4, none of the vias 94 are disposed between the gaps 86, 88 (e.g., between an inner edge 96 of the metal ring 82 and the gap 88), and one of the vias 94 is disposed along or at an outer edge 98 of the metal ring 82. In alternative embodiments, one of the vias 94 may be disposed between the gaps 86, 88, and/or one of the vias 94 need not be positioned at the outer edge 98 of the metal ring 82.

One or more other components or aspects of the metal ring 82 may be configured as described above. For example, the metal ring 82 may be configured as part of an impedance-symmetric guard ring, as described above in connection with FIG. 1. To attain impedance symmetry, the grounding point of the guard ring may be selected with respect to the midpoint between the outer or distal ends of the gaps 86 and 88 (or vice versa). The metal rings described elsewhere herein may be configured in a manner similar to the metal ring 82.

Figure 5:
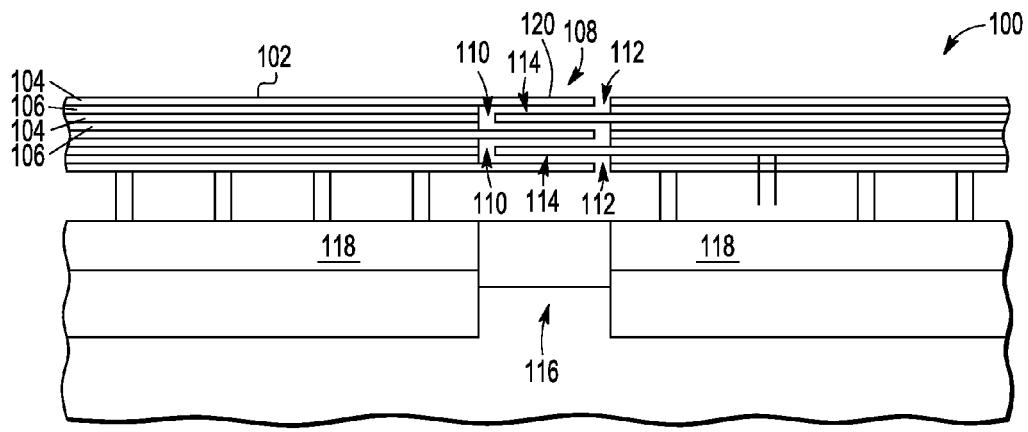
FIG. 5 is a cross-sectional, schematic view of an exemplary discontinuous guard ring with interlaced metal stack layers having non-aligned gaps in accordance with one embodiment.

FIG. 5 is a cross-sectional view of a guard ring 100 with an alternative gap configuration. As in one or more of the other embodiments described herein, the guard ring 100 includes a metal ring 102 that, in turn, includes a stack of metal layers. In this example, the stack includes alternating layers of two metals, a metal layer 104 and a metal layer 106. The metal layers 104, 106 may include the metals referenced above in connection with the embodiment of FIG. 4. Adjacent pairs of the metal layers 104, 106 are separated by a respective dielectric layer or film, and connected (outside of the gap in the metal ring 102) to one another by vias, as described above. FIG. 5 may alternatively be viewed as depicting the dielectric layers or films. For instance, the layers 106 may be considered the dielectric layers and understood to fill in the gaps as described above. Additional or alternative metals may be used or incorporated into the stack.

A gap 108 of the metal ring 102 is formed from respective metal layer gaps in the metal layers 104, 106. In this embodiment, the gap 108 includes metal layer gaps 110, 112 in the metal layers 104, and metal layer gaps 114 in the metal layers 106. The metal layer gaps 110, 112 are shorter (e.g., laterally narrower) than the metal layer gaps 114. In this example, each of the metal layer gaps 114 have a length (e.g., lateral width) that corresponds with the size of a gap 116 in a ring-shaped region 118 of the guard ring 100. The lengths of the metal layer gaps 110, 112 are thus also shorter than a length of the gap 116. The smaller metal layer gaps 110, 112 are formed by flaps 120 or fingers of the metal layers 104 that extend laterally across a portion of the gaps 114. The flaps 120 may be supported by one or more passivation layers as described herein.

The metal layer gaps 110 and the metal layer gaps 112 are laterally offset or not aligned with one another. In this example, the flaps 120 of the metal layers 104 alternately extend from opposing ends of the metal ring 102 and partially laterally overlap one another to establish an interlaced flap arrangement. The extent of the overlap may vary. Each flap 120 may terminate at any position within the gap 108. In this example, the flaps 120 extend over most of the gap 108 to terminate at lateral positions closer to the other end of the metal ring 102 (e.g., the end opposite from the end from which the flaps 120 extend). In other examples, the flaps 120 extend over less than half of the gap 108.

The deposition of the metal layers 104 in the gap 108 may be supported by intervening dielectric layers. For example, after the deposition of a first one of the metal layers 104, a dielectric material, such as silicon nitride or silicon dioxide, is deposited in the area of the gap 108. The dielectric material fills the metal layer gap 112 and forms a passivation layer on the metal layer 104 in the area of the gap 108. A first one of the metal layers 106 is then deposited on the metal layer 104 and etched to form the metal layer gap 114 (which, in this example, corresponds with the area of the gap 108). A second one of the metal layers 106 is then deposited and patterned to define the metal layer gap 110. Another passivation layer is deposited and patterned to fill the metal layer gap 110 and cover the metal layer 106 in the area of the gap 108, as described above. The deposition procedure may then continue to form a desired number of metal layers having respective metal layer gaps.

The arrangement of the metal layer gaps 110, 112 may vary from the example shown in further ways. For example, in some embodiments, the metal layer gaps 110 need not be aligned with one another as shown. Similarly, the metal layer gaps 112 need not be aligned with one another as shown. The metal layer gaps 110, 112 need not have the same size (e.g., length).

Figure 6:
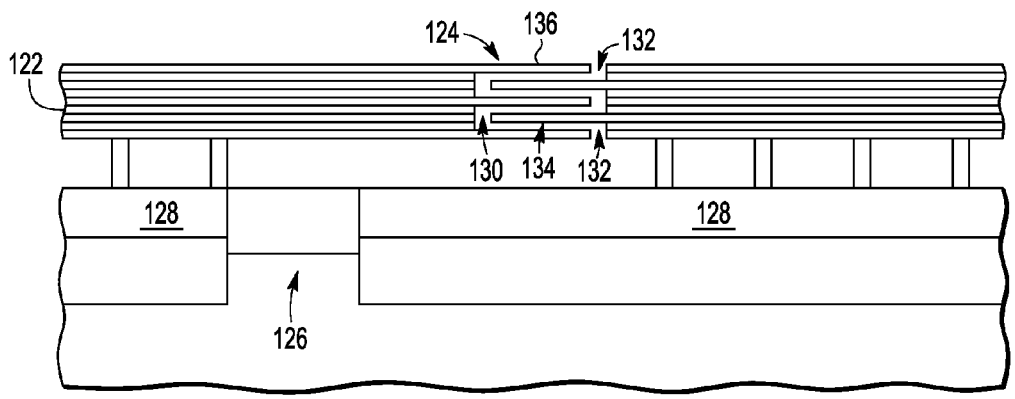
FIG. 6 shows a cross-sectional view of an exemplary discontinuous guard ring with a substrate gap offset from non-aligned gaps in interlaced metal stack layers in accordance with one embodiment.

FIG. 6 is a cross-sectional view of a guard ring 120 with another flap gap configuration. In this embodiment, the guard ring 120 includes a metal ring 122 with a collective gap 124 offset from a gap 126 in a ring-shaped region 128. The metal ring 122 and the ring-shaped region 128 may be formed as described above. The gaps 124, 126 may be laterally offset as described above in connection with FIG. 4. In this embodiment, the gap 124 includes a set of constituent gaps formed by interlaced metal layers of a metal stack, as described above in connection with FIG. 5. The gap 124 may thus include respective, non-aligned metal layer gaps 130, 132 in some of the constituent metal layers, as well as larger metal layer gaps 134 in other constituent metal layers. The positioning of the gaps 130, 132 and other aspects of the interlaced arrangement may vary as described above. In contrast to the embodiment of FIG. 5, each of the metal layer gaps 130, 132, 134 is offset from the gap 126 in the ring-shaped region 128. The extent to which the gaps 124, 126 are offset may vary as described above.

The configuration of the gap 124 (and the gap 108 of FIG. 5) may be customized to control a capacitance to create a filter for the behavior of the guard ring 120. The capacitance is established via the overlapping metals in the gap 124. Additional capacitance is established between the lowest metal layer of the metal ring 122 and the ring-shaped region 128. These capacitances are disposed in parallel to define the behavior of the filter.

Figure 7:
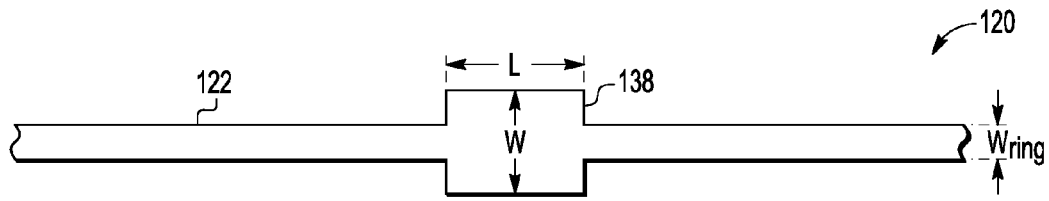
FIG. 7 shows a top view of the metal stack layers of the discontinuous guard ring of FIG. 6.

FIG. 7 is a top view of the metal ring 122 to depict a non-uniform lateral dimension (e.g., width) of the metal ring 122. The non-uniformity may be disposed at the gap 124. The guard ring 120 presents one example of how a lateral dimension of the metal ring 122 may vary along the length of the guard ring 120. Away from or outside of the gap 124, the metal ring 122 has a lateral width $W_{ring}$, which may be selected to provide a desired level of noise isolation. At and/or near the gap 124, the lateral width of flaps or fingers 136 of the metal ring 122 is increased to a width W. In this example, the lateral width of the metal ring 122 is equal to the width W over a section 138 having a length L. The section 138 may correspond with the length of the gap 124 and the constituent gap 134 (and, thus, the combined (overlapping) length of the fingers 136). The fingers 136 define the constituent gaps 130, 132. Either one or both of the lateral dimensions W and L may be adjusted. For example, the section 138 may be shorter or longer than the length of the gap 124. In other embodiments, the section 138 may also or alternatively be laterally offset from the gap 124 to any desired extent. These lateral dimensions of the metal ring 122 may be used as design parameters. For example, the section 138 may be spaced from the gap 124 to adjust an impedance of a segment of the metal ring 122.

Each of the guard rings described herein may include one or more sections patterned to include a wider section similar to the section 136 shown in FIG. 6. For example, the flaps of one or more of the above-described embodiments may have an increased width. The width of the metal rings of non-flap embodiments may also be increased at or near the fingers or ends of the metal ring.

The gaps in any of the above-described metal rings may have a length based on the lateral width (e.g., $W_{ring}$) of the metal ring. In some examples, the collective gaps (as opposed to the constituent metal layer gaps) in the metal rings may have a gap length to ring lateral width ratio falling in a range of about 1:1 to about 3:1. In one example, the gap length may be about 3 µm for a lateral ring width of about 1 µm. Other lengths and widths may be used. Gaps sizes that fall within the range may avoid allowing an unacceptable level of noise to reach the circuit block to be isolated. Other ratios may be used depending, for instance, on variances in other design parameters and/or characteristics of the noise environment. For example, the gap length may be specified relative to the overall length of the guard ring. In some cases, the gap length may be less than about 5% of the overall length of the guard ring.

The dopant concentrations, thicknesses, and other characteristics of the above-described semiconductor regions in the semiconductor substrate 16 may vary.

The concentrations and thicknesses may be different in other embodiments. For example, the dopant concentration of the original substrate 50 may vary considerably.

Figure 8:
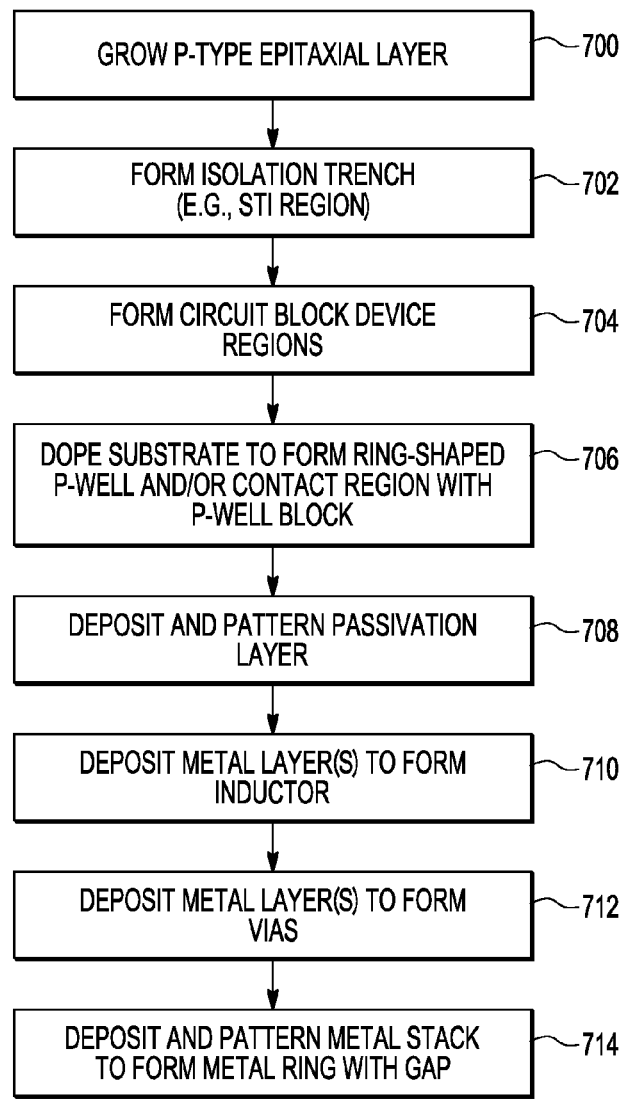
FIG. 8 is a flow diagram of an exemplary fabrication sequence to construct a discontinuous guard ring in accordance with one embodiment.

FIG. 8 shows an exemplary fabrication method for fabricating an IC chip with a discontinuous guard ring as described above. The IC chip is fabricated with a semiconductor substrate, the regions or layers of which may have the conductivity types of the examples described above, or be alternatively configured with opposite conductivity types. The method includes a sequence of acts or steps, only the salient of which are depicted for convenience in illustration. The ordering of the acts may vary in other embodiments. For example, an isolation trench may be formed after the ring-shaped region of the guard ring (and/or other regions in the semiconductor substrate) is formed.

The method may begin with, or include, an act 700 in which a p-type epitaxial layer, such as the epitaxial layer 47 (FIG. 2) is grown on a semiconductor substrate. The epitaxial layer may define a surface of the semiconductor substrate. The semiconductor substrate may be configured as a bulk substrate. The semiconductor substrate may include an original p-type semiconductor substrate on which the insulator, epitaxial, or other layers are grown or otherwise formed. Any number of epitaxial layers may be grown. In some cases, the p-type epitaxial layer corresponds with a p-type well in which a ring-shaped region of the guard ring is formed.

In an act 702, one or more STI regions or other isolation trenches may then be formed at the surface of the semiconductor substrate. One of the STI regions may be formed at a location of a gap in a ring-shaped region of a guard ring, as described above. The STI regions may be formed via any now known or hereafter developed procedure. For example, the act 702 may include the formation of a trench and the deposition (e.g., chemical vapor deposition, or CVD) of one or more materials in the trench. In some embodiments, the trench is filled with silicon oxide. Additional or alternative materials may be deposited. In an alternative embodiment, the STI region is formed after one or more dopant implantation procedures are implemented.

In an act 704, a number of device regions are formed in the epitaxial layer to define devices of circuit blocks of the IC chip. For example, body, source/drain, and other regions of various types of transistor devices are formed via a number of dopant implantation procedures. One or more of the implantation procedures may be used to form the guard ring.

The semiconductor substrate may also be doped via one or more implantation procedures in an act 706 directed to forming the substrate portion(s) of the guard ring. In some cases, a dopant implantation procedure is implemented to form a p-type well (or p-well), such as the p-type well 46 (FIG. 2). Alternatively or additionally, a dopant implantation procedure may be implemented to form a ring-shaped region, such as the ring-shaped region 42 (FIG. 2). The ring-shaped region may be formed within the p-type well. As described above, the ring-shaped portion has a gap to reduce electromagnetic coupling with the inductor. The dopant implantation procedure directed to forming the p-type well may be implemented with a mask configured to form a ring block, such as the p-well block 72 (FIG. 3), in the gap adjacent the STI region.

In some embodiments, the acts 704 and 706 may be combined. The implantation procedures used to form one or more device regions may also be used to form the p-type well and/or the ring-shaped region. For example, the p-type well may be formed by an implantation procedure configured to also form a body region of a FET device. The ring-shaped region may be formed by an implantation procedure configured to also form a contact region for the body region (or any other contact region having the same conductivity type, e.g., p-type).

A passivation layer may be deposited and patterned via, e.g., photolithography on the surface of the semiconductor substrate in an act 708. The passivation layer may include one or more dielectric materials, such as silicon nitride. The passivation layer may be patterned to facilitate the formation of vias, such as the vias 44 (FIG. 2), and/or other conductive structures, such as an inductor of the circuit block surrounded by the guard ring, at the surface of the semiconductor substrate. One or more of the conductive structures (other than the vias) may be deposited on the passivation layer despite the patterning thereof.

In act 710, one or more conductive layers are deposited on the semiconductor substrate or on a layer supported by the semiconductor substrate. The conductive layers may include one or more metals or other conductive materials, such as polysilicon. The conductive layer(s) may then be selectively lifted off or removed via, e.g., an etching procedure, to form an inductor, such as the inductor 20 (FIG. 1). The conductive layer(s) may be used to form additional or alternative conductive structures supported by the semiconductor substrate, such as interconnects or pads.

One or more conductive layers may also be deposited in an act 712 to form vias or other conductive structures (e.g., interconnects, pads, etc.). The conductive layers may include one or more metals or other conductive materials, such as polysilicon. The vias are configured to electrically couple the components of the guard ring to one another. In some cases, the acts 710 and 712 are combined, in which case the inductor and the vias are formed from the same metal layer(s). In other cases, one or more passivation layers may be deposited between the respective deposition procedures used to form the different structures.

In an act 714, one or more metal layers (e.g., a metal stack) are deposited and patterned to form a metal ring of the guard ring, such as the metal ring 40 (FIG. 2). The metal stack may include any number of constituent metal layers and dielectric layers between such constituent metal layers. As described above, the metal ring has a respective gap to reduce electromagnetic coupling with the inductor. The respective gaps in the metal layers may or may not be aligned with one another. In some cases, the metal layers have a common pattern to form a set of aligned constituent gaps and define a non-offset gap arrangement (see, e.g., the gap 44 shown in FIG. 2). In other cases, the metal layers are patterned differently to form interlaced fingers and define an offset gap arrangement, such as the arrangement shown in FIG. 5.

The gaps in the metal ring and the ring-shaped region may be not aligned with one another as described above.

Additional acts may be implemented at various points during the fabrication process. For example, one or more additional passivation layers may be deposited between the acts 710 and 712, between the acts 712 and 714, and/or between the deposition of respective metal layers of a metal stack during the act 714. One or more other acts may be directed to defining respective active areas of the devices of the circuit block(s). In some cases, such acts may include the formation of any number of STI or DTI regions. The fabrication process may also include a number of acts directed to wafer singulation (or dicing) and packaging of the resulting dies to provide IC chips or other electronic apparatus of the disclosed embodiments.

In a first aspect, an electronic apparatus includes a semiconductor substrate, a circuit block disposed in and supported by the semiconductor substrate and comprising an inductor, and a discontinuous noise isolation guard ring surrounding the circuit block. The discontinuous noise isolation guard ring includes a metal ring supported by the semiconductor substrate and a ring-shaped region disposed in the semiconductor substrate, having a dopant concentration level, and electrically coupled to the metal ring, to block noise in the semiconductor substrate from reaching the circuit block. The metal ring has a first gap and the ring-shaped region has a second gap.

In a second aspect, an IC chip includes a semiconductor substrate, a circuit block disposed in and supported by the semiconductor substrate and comprising an inductor, and a discontinuous noise isolation guard ring surrounding the circuit block, and connected to ground at a grounding point along the discontinuous noise isolation guard ring. The discontinuous noise isolation guard ring includes a metal ring supported by the semiconductor substrate and a ring-shaped region disposed in the semiconductor substrate, having a dopant concentration level, and electrically coupled to the metal ring, to block noise in the semiconductor substrate from reaching the circuit. The metal ring has a first gap and the ring-shaped region has a second gap to reduce electromagnetic coupling with the inductor. The first and second gaps are not aligned with one another.

In a third aspect, a method of fabricating an electronic apparatus includes forming device regions of a circuit block in a semiconductor substrate, doping the semiconductor substrate to form a ring-shaped region of a noise isolation guard ring in the semiconductor substrate, the noise isolation guard ring surrounding the circuit block, and depositing a metal ring of the noise isolation guard ring, the metal ring being electrically coupled to the ring-shaped region. The metal ring has a first gap and the ring-shaped region has a second gap to reduce electromagnetic coupling with an inductor of the circuit block.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. An electronic apparatus comprising:
a semiconductor substrate;
a circuit block disposed in and supported by the semiconductor substrate and comprising an inductor; and
a discontinuous noise isolation guard ring surrounding the circuit block and comprising:
 a metal ring supported by the semiconductor substrate; and
 a ring-shaped region disposed in the semiconductor substrate, having a dopant concentration level, and electrically coupled to the metal ring, to inhibit noise in the semiconductor substrate from reaching the circuit block;
wherein the metal ring has a first gap and the ring-shaped region has a second gap.

2. The electronic apparatus of claim 1, wherein the first and second gaps are not aligned with one another.

3. The electronic apparatus of claim 1, wherein the metal ring extends across the second gap in the ring-shaped region.

4. The electronic apparatus of claim 1, wherein:
the metal ring comprises first and second metal layers;
the first metal layer comprises a first metal layer gap;
the second metal layer comprises a second metal layer gap; and
the first and second metal layer gaps are not aligned with one another.

5. The electronic apparatus of claim 4, wherein the second gap in the ring-shaped region is not aligned with the first metal layer gap and not aligned with the second metal layer gap.

6. The electronic apparatus of claim 4, wherein:
the first and second metal layers comprise respective fingers at which the first and second metal layer gaps are defined; and
a lateral width of the respective fingers is greater than a lateral width of a remainder of the metal ring.

7. The electronic apparatus of claim 4, wherein a length of the first and second metal layer gaps is shorter than a length of the gap in the ring-shaped region.

8. The electronic apparatus of claim 1, wherein the second gap in the ring-shaped region comprises a trench isolation region disposed at a surface of the semiconductor substrate.

9. The electronic apparatus of claim 8, wherein the second gap in the ring-shaped region further comprises a p-well block region in the semiconductor substrate adjacent the trench isolation region.

10. The electronic apparatus of claim 1, wherein:
the discontinuous noise isolation guard ring is connected to ground at a grounding point along the discontinuous noise isolation guard ring; and
the first and second gaps are positioned along the discontinuous noise isolation guard ring relative to the grounding point to establish a pair of impedance-symmetric segments of the discontinuous noise isolation guard ring.

11. The electronic apparatus of claim 1, wherein:
the discontinuous noise isolation guard ring is connected to ground at a position along the discontinuous noise isolation guard ring proximate a noise source; and
the first and second gaps are disposed along the discontinuous noise isolation guard ring distal the noise source.

12. The electronic apparatus of claim 1, wherein the metal ring has a non-uniform lateral width.

13. The electronic apparatus of claim 1, wherein the first and second gaps are configured to reduce electromagnetic coupling with the inductor.

14. An integrated circuit (IC) chip comprising:
a semiconductor substrate;
a circuit block disposed in and supported by the semiconductor substrate and comprising an inductor; and
a discontinuous noise isolation guard ring surrounding the circuit block, connected to ground at a grounding point along the discontinuous noise isolation guard ring, and comprising:
a metal ring supported by the semiconductor substrate; and
a ring-shaped region disposed in the semiconductor substrate, having a dopant concentration level, and electrically coupled to the metal ring, to inhibit noise in the semiconductor substrate from reaching the circuit;
wherein the metal ring has a first gap and the ring-shaped region has a second gap to reduce electromagnetic coupling with the inductor; and
wherein the first and second gaps are not aligned with one another.

15. The IC chip of claim 14, wherein the first and second gaps are positioned along the discontinuous noise isolation guard ring relative to the grounding point to establish a pair of segments of the discontinuous noise isolation guard ring having impedance-symmetric lengths.

16. The IC chip of claim 14, wherein:
the metal ring comprises first and second metal layers;
the first metal layer comprises a first metal layer gap;
the second metal layer comprises a second metal layer gap; and
the first and second metal layer gaps are not aligned with one another.

17. The IC chip of claim 16, wherein respective fingers of the first and second metal layers that define the first and second metal layer gaps are wider than segments of the metal ring away from the first gap.

18. A method of fabricating an electronic apparatus, the method comprising:
forming device regions of a circuit block in a semiconductor substrate;
doping the semiconductor substrate to form a ring-shaped region of a noise isolation guard ring in the semiconductor substrate, the noise isolation guard ring surrounding the circuit block; and
depositing a metal ring of the noise isolation guard ring, the metal ring being electrically coupled to the ring-shaped region;
wherein the metal ring has a first gap and the ring-shaped region has a second gap to reduce electromagnetic coupling with an inductor of the circuit block.

19. The method of claim 18, further comprising forming an isolation trench at a location of the second gap in the ring-shaped region.

20. The method of claim 18, wherein depositing the metal ring comprises depositing first and second metal layers, wherein:
the first metal layer comprises a first metal layer gap;
the second metal layer comprises a second metal layer gap; and
the first and second metal layer gaps are not aligned with one another.

* * * * *